(12) United States Patent
Stettner

(10) Patent No.: US 8,890,587 B2
(45) Date of Patent: Nov. 18, 2014

(54) ADAPTIVE SLOPE GENERATOR

(71) Applicant: Texas Instruments Deutschland GmbH, Freising (DE)

(72) Inventor: Ferdinand Stettner, Dachau (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 13/761,976

(22) Filed: Feb. 7, 2013

(65) Prior Publication Data

US 2014/0218075 A1    Aug. 7, 2014

(51) Int. Cl.
  *H03K 4/06*     (2006.01)
  *H03K 4/90*     (2006.01)
(52) U.S. Cl.
  CPC ........................................ *H03K 4/90* (2013.01)
  USPC ............................ 327/132; 327/139; 323/288
(58) Field of Classification Search
  CPC ................ H02M 3/156; H02M 3/157; H02M 2001/0025; H02M 2001/0029
  USPC ......... 327/131, 132, 134, 135, 137, 139, 140; 323/288
  See application file for complete search history.

(56) References Cited

U.S. PATENT DOCUMENTS

| | | | |
|---|---|---|---|
| 6,522,116 | B1 | 2/2003 | Jordan |
| 7,126,318 | B2 | 10/2006 | Oswald et al. |
| 7,265,530 | B1 | 9/2007 | Broach et al. |
| 7,425,819 | B2 | 9/2008 | Isobe |
| 7,479,778 | B1 * | 1/2009 | Broach et al. ............. 324/117 R |
| 7,498,792 | B2 * | 3/2009 | Chang et al. .................. 323/288 |
| 8,278,899 | B2 | 10/2012 | Scjafmeister et al. |
| 8,310,221 | B2 | 11/2012 | Herzer et al. |
| 8,587,265 | B2 * | 11/2013 | Nishimori et al. ............ 323/242 |
| 2010/0253313 | A1 * | 10/2010 | Herzer et al. ................. 323/312 |

* cited by examiner

*Primary Examiner* — William Hernandez
(74) *Attorney, Agent, or Firm* — Alan A. R. Cooper; Frederick J. Telecky, Jr.

(57) ABSTRACT

An adaptive slope generator can include a current mirror configured to receive a multiplied current that varies as a function of an output voltage and a switching frequency of a switching current. The output voltage can characterize the switching current provided to a load coupled to an inductor. The current mirror can also be configured to receive an oscillation current. The oscillation current can have an amplitude that corresponds to the switching frequency of the switching current. The current mirror can be further configured to generate an output current substantially equivalent to the product of the oscillation current and the output voltage. The adaptive slope generator can also include a ramp generator configured to generate a compensation signal based on the output current. The compensation signal can have a sawtooth shape and a slope that varies as a function of the output voltage.

20 Claims, 6 Drawing Sheets

ADAPTIVE SLOPE GENERATOR

TECHNICAL FIELD

This disclosure relates to an adaptive slope generator. More particularly, this disclosure relates to an adaptive slope generator that generates a slope compensation signal.

BACKGROUND

A DC-to-DC converter is an electronic circuit which converts a source of direct current (DC) from one voltage level to another. A DC-to-DC converter can be categorized as a class of power converters.

DC-to-DC converters can be employed in portable electronic devices such as cellular phones and laptop computers, which are supplied with power from batteries primarily. Such electronic devices often contain several sub-circuits, each with its own voltage level requirement different from that supplied by the battery or an external supply (sometimes higher or lower than the supply voltage). Additionally, the battery voltage declines as the stored power in the battery is drained. Switched DC-to-DC converters can increase voltage from a partially lowered battery voltage.

SUMMARY

In one example, an adaptive slope generator can include a current mirror configured to receive a multiplied current that varies as a function of an output voltage and a switching frequency of a switching current. The output voltage can characterize the switching current provided to a load coupled to an inductor (e.g., a switched inductor). The current mirror can also be configured to receive an oscillation current. The oscillation current can have an amplitude that corresponds to the switching frequency of the switching current. The current mirror can be further configured to generate an output current substantially equivalent to the product of the oscillation current and the output voltage. The adaptive slope generator can also include a ramp generator configured to generate a compensation signal based on the output current. The compensation signal can have a sawtooth shape and a slope that varies as a function of the output voltage.

In another example, an adaptive slope generator can include a ramp generator configured to receive a clock signal. The ramp generator can also be configured to receive an output current that characterizes a product of an output voltage and an oscillation current. The ramp generator can further be configured to generate a compensation signal having a sawtooth shape and a slope that varies as a function of the output voltage and a capacitance of a slope compensation capacitor. The output voltage can correspond to voltage provided to a load that can be coupled to an inductor. The oscillation current can have an amplitude that corresponds to a switching frequency of a switching current provided to the load.

In yet another example, an integrated circuit (IC) chip can include an error compensated voltage to current (V-I) converter configured to output a first current that characterizes an output voltage. The output voltage can characterize a switching current provided to a load coupled to an inductor. The IC chip can also include an oscillator configured to provide an oscillation current that can have an amplitude that corresponds to a switching frequency of the switching current. The IC chip can further include a reference V-I converter configured to generate a reference current based on a reference voltage. The IC chip can still further include a translinear multiplier configured to generate a multiplied current. The multiplied current can be substantially equal to a product of the output voltage and the oscillation current minus the oscillation current. The IC chip can yet further include a current mirror configured to generate an output current substantially equivalent to the product of the oscillation current and the output voltage. The IC chip can additionally include a ramp generator configured to generate a compensation signal having a sawtooth shape and a slope that varies as a function of the output voltage. The slope of the switching current can be based on the compensation signal.

DETAILED DESCRIPTION

A current mode DC-to-DC converter can be employed to control a switching current to drive a load that can be coupled to an inductor (e.g., a switched inductor). In a current-mode DC-to-DC converter, the flow of current to the load is provided as discrete pulses and can be controlled by a controller, which can be referred to as a switching current. The controller can measure the current within the current-mode DC-to-DC converter, and operate a switch to control the switching current based on this measured current. By controlling the duty cycle of the switch (e.g., the percentage of time that the switch is ON relative to the total period of the switching cycle), the amount of current supplied by the current mode DC-to-DC can be regulated so as to provide the desired output level. At a duty cycle at or above about 50%, instability occurs due to a sensed current in the inductor coupled to the load. In order to maintain stability in a current mode DC-to-DC converter, the signal employed by the controller to control the switch can be adjusted by a slope compensation signal.

A slope compensation signal can be generated by an adaptive slope generator. The slope compensation signal can be generated by the adaptive slope generator based, for example on an output voltage (e.g., a feedback signal) that corresponds to voltage across the load. The slope compensation signal can have a slope that is based on the output voltage and a switching frequency of the switching current. The adaptive slope generator can obviate the need for a current peak limiter that could cause undesirable effects similar to that of a voltage mode DC-to-DC converter (e.g., increased number of poles and zeros).

Figure 1:
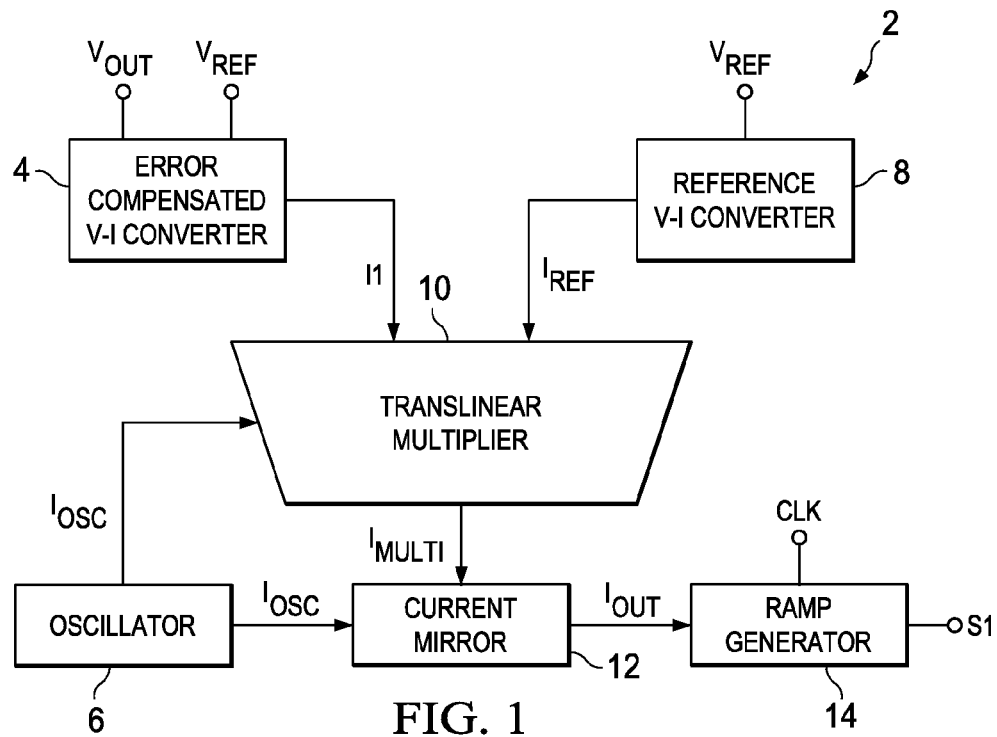
FIG. 1 illustrates an example of an adaptive slope generator.

FIG. 1 illustrates a block diagram of an adaptive slope generator 2 that can be employed to monitor and/or adjust a slope of a current driven voltage converter (e.g., a current mode DC-DC converter). FIGS. 2-9 illustrate examples of circuit diagrams that could be employed as components of the adaptive slope generator 2. For purposes of simplification of explanation, the same reference numbers and terms are employed in FIGS. 1-9 to denote the same structure and function. In some examples, the adaptive slope generator 2 could be implemented, wholly or partially on an integrated circuit (IC) chip. In such a situation, the adaptive slope generator 2 could be implemented on a dedicated IC chip, or the adaptive slope generator 2 could be implemented as a component on an IC chip. In other examples, the adaptive slope generator 2 could be implemented as discrete electrical components. In still other examples, the adaptive slope generator 2 could be implemented as a combination of an IC chip and discrete circuit components. The adaptive slope generator 2 can be configured to provide a slope compensation signal (S1) that has a sawtooth wave. The sawtooth wave can be employed for slope compensation to stabilize a current loop for duty cycles that are both below and above 50%.

The adaptive slope generator 2 can include an error compensated voltage to current (V-I) converter 4 that can convert an output signal $V_{OUT}$ into a corresponding current $I_1$. $V_{OUT}$ can correspond to a voltage drop across a load that is driven by a switching current $I_S$ that could benefit from slope compensation. In some examples, the switching current could be employed to drive a light emitting diode (LED) or be employed in a power transformer, a laptop computer, a mobile phone, etc.

Figure 2:
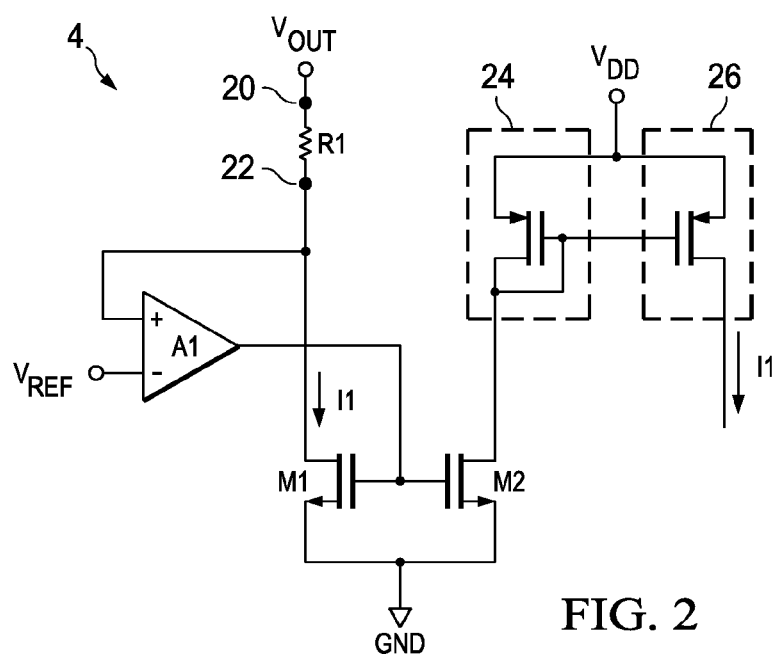
FIG. 2 illustrates an example of a circuit diagram of an error compensated voltage-to-current (V-I) converter.

FIG. 2 illustrates an example of a circuit diagram that could be employed to implement the error compensated V-I converter 4. The error compensated V-I converter 4 that can receive the output signal $V_{OUT}$, which can be provided to a given terminal 20 of a sensing (or reference) resistor, $R_1$. Another terminal 22 of the sensing (or reference) resistor $R_1$ can be connected to a non-inverting input of an operational amplifier (op-amp) A1. The other terminal of the sensing (or reference) resistor R1 can also be coupled to a drain of an n-channel metal-oxide-semiconductor field-effect transistor (nMOS) M1.

A reference voltage $V_{REF}$ can be coupled to an inverting input of the op-amp A1. The reference voltage $V_{REF}$ can be set to a predetermined value and can vary based on the environment of application of the adaptive slope generator 2. In some examples, $V_{REF}$ can have a value of 1 volt (V). The output terminal of the op-amp A1 can be provided to the gate of the nMOS M1 and to the gate of a second nMOS M2. A source of the nMOSs M1 and M2 can be coupled to an electrically neutral node (e.g., '0' V, such as ground), which is labeled in FIG. 2 as "GND." Throughout the present examples, multiple electrically neutral nodes are employed. Each such electrically neutral node could be connected to the same node or a different node.

The current flowing into the drain of the nMOS M1 can be labeled as $I_1$. $I_1$ can be determined from Equation 1:

$$I_1 = \frac{(V_{OUT} - V_{REF})}{R_1} \quad \text{Equation 1}$$

wherein:
$V_{OUT}$ is the output voltage;
$V_{REF}$ is the reference voltage; and
$R_1$ is the resistance of the sensing (or reference) resistor.

The drain of the nMOS M2 can be coupled to a drain and a gate of a first p-channel metal-oxide-semiconductor field effect transistor (pMOS) 24. A source of the first pMOS 24 can be coupled to a voltage source which can be set to a predetermined value (e.g., 5 V) which is labeled in FIG. 2 as "$V_{DD}$". A second pMOS 26 can be arranged in a current mirror configuration with the first pMOS 24. Thus, a drain of the second pMOS 26 can provide an output current equal to $I_1$.

Figure 3:
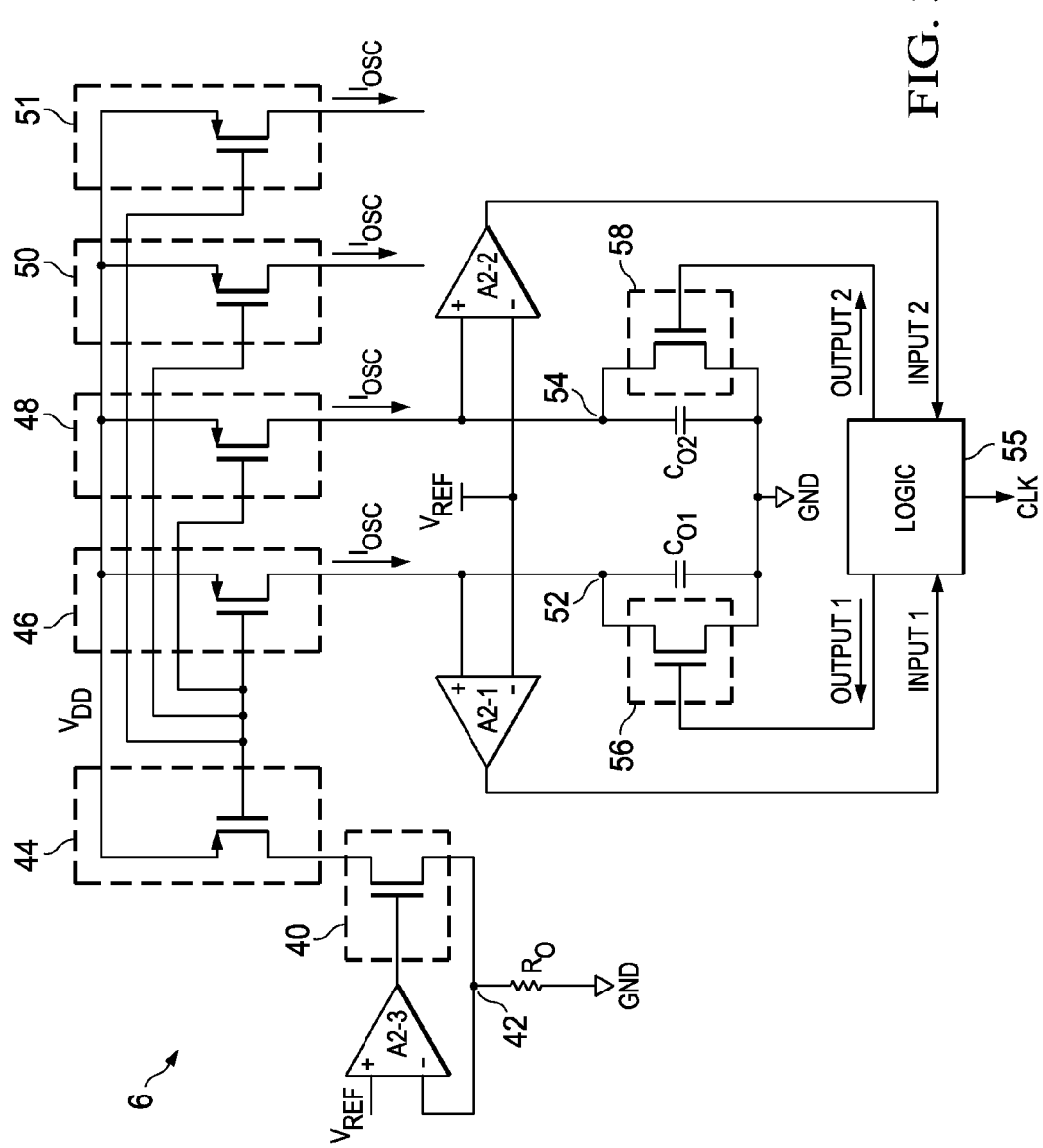
FIG. 3 illustrates an example of a circuit diagram of an oscillator.

Referring back to FIG. 1, the adaptive slope generator 2 can also include an oscillator 6 that can generate an oscillation current $I_{OSC}$. FIG. 3 illustrates an example of a circuit diagram that can be employed to implement the oscillator 6. The oscillator 6 can include a pair of op-amps A2-1 and A2-2 that are coupled together via an inverting input of each of the op-amp A2-1 and A2-2. Additionally, each of the inverting inputs of the op-amps A2-1 and A2-2 can be coupled to the reference voltage $V_{REF}$.

Another op-amp A2-3 can be employed to generate the oscillation current $I_{OSC}$. In such a situation, the reference voltage $V_{REF}$ can be provided to a non-inverting input of the op-amp A2-3. An output of op-amp A2-3 can be provided to a gate of an nMOS 40. A source of the nMOS 40 can be coupled to a feedback node 42. The feedback node 42 can be coupled to an inverting input of the op-amp A2-3. Additionally, a first node of an oscillation resistor $R_O$ can be coupled to the feedback node 42, and a second node can be coupled to an electrically neutral node (e.g., ground), which is labeled in FIG. 3 as "GND".

A drain of the nMOS 40 can be coupled to a drain and a gate of a pMOS 44. Additionally, the oscillator 6 can include pMOSs 46, 48, 50 and 51 that also have gates coupled to the drain and gate of the pMOS 44, such the pMOSs 46, 48, 50 and 51 are arranged in a current mirror configuration with respect to pMOS 44. Additionally, each of the pMOSs 44, 46, 48, 50 and 51 can have a source coupled to a voltage source (e.g., about 5 V) that is labeled in FIG. 3 as "$V_{DD}$". A drain of each of the pMOSs 46, 48, 50 and 51 can provide the oscillation current $I_{OSC}$. The oscillation current $I_{OSC}$ can be a relatively constant current has an amplitude based on a frequency of the switching current. For example, if the switching current has a frequency of about 4 mega-Hertz (MHz), the oscillation current $I_{OSC}$ can be a constant current of about 60 micro-amperes (μA). The amplitude of the oscillation current $I_{OSC}$ can also be based, for example, on a resistance of the oscillation resistor $R_O$.

Moreover, a non-inverting input of the op-amp A2-1 can be coupled to a given node 52 and a non-inverting input of the op-amp A2-2 can be coupled to another node 54. An output terminal of the op-amp A2-1 can be coupled to a first input (labeled in FIG. 3 as "INPUT 1") of a logic block 55 (e.g., digital logic). Similarly, an output terminal of op-amp A2-2 can be coupled to a second input (labeled in FIG. 3 as "INPUT 2") of the logic block 55.

Each of the given node 52 and the other node 54 can receive the oscillation current $I_{OSC}$ from pMOSs 46 and 48, respectively. The given node 52 can also be coupled to a drain of an nMOS 56 and to a first terminal of an oscillation capacitor $C_{O1}$. In a similar manner, the other node 54 can be coupled to a drain of an nMOS 58 and to a first terminal of an oscillation capacitor $C_{O2}$. Each of the capacitors $C_{O1}$ and $C_{O2}$ can have a current that varies based on the oscillation resistor $R_O$. As one example, the capacitors $C_{O1}$ and $C_{O2}$ can each have a capacitance of about 5 Pico-Farads (pF). A source of the nMOS 56 and the nMOS 58 as well as a second terminal of each oscillation capacitor $C_{O1}$ and $C_{O2}$ can be coupled to an electrically neutral node (e.g., ground). A gate of the nMOS 56 can be driven by a first output (labeled in FIG. 3 as "OUTPUT 1") of the logic block 55. Similarly, a gate of the nMOS 58 can be driven by a second output (labeled in FIG. 3 as "OUTPUT 2") of the logic block 55. The logic block 55 can employ digital logic to provide a clock signal (CLK) based on the output of op-amps A2-1 and A2-2.

Figure 4:
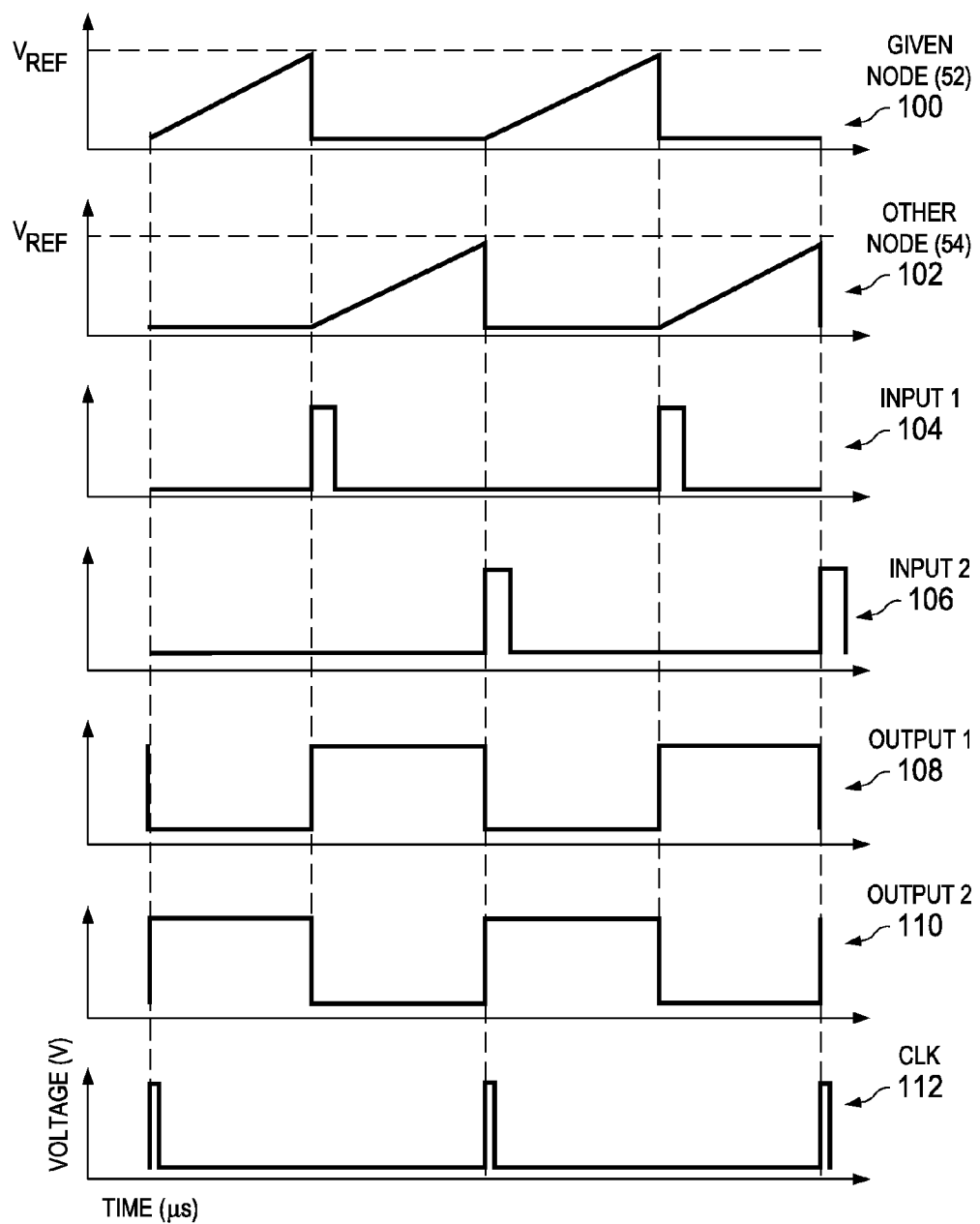
FIG. 4 illustrates examples of timing diagrams of signals in FIG. 3.

FIG. 4 illustrates an example of timing diagrams that could represent voltages in volts (V) plotted as a function of time, in microseconds (µ) for voltages in FIG. 3. In particular, a timing diagram 100 for a voltage observed at the given node 52 and a timing diagram 102 for a voltage observed at the other node are included. A timing diagram 104 depicting a voltage at the first input (labeled in FIGS. 2 and 3 as "INPUT 1") of the logic block 55 is also included. Similarly, timing diagram 106 depicting a voltage at the second input (labeled in FIGS. 2 and 3 as "INPUT 2") of the logic block 55 is also included. Further, timing diagrams 106 and 108 depicting a voltage at the first and second outputs (labeled in FIGS. 2 and 3 as "OUTPUT 1" and "OUTPUT 2", respectively) are included. Additionally, a timing diagram 112 of the clock signal (labeled in FIGS. 2 and 3 "CLK") is included as well.

As illustrated in FIG. 4, the given node 52 and the other node 54 can have a sawtooth wave shape that rises to the reference voltage $V_{REF}$. Moreover, as illustrated, OUTPUT 1 and OUTPUT 2 are complementary signals. As shown, a rising edge at OUTPUT 1 can trigger a rising edge of the given node 52. Additionally, a falling edge at OUTPUT 1 can trigger a falling edge of the given node 52. In a similar manner a rising edge at OUTPUT 2 can trigger a rising edge of the other node 54 and a falling edge at OUTPUT 2 can trigger a falling edge of the other node 54.

Additionally, a rising edge at INPUT 1 can trigger a rising edge of OUTPUT 1 and a rising edge of INPUT 2 can trigger a rising edge at OUTPUT 2. Moreover, a falling edge of INPUT 2 can trigger a falling edge of OUTPUT 1 and a falling edge of INPUT 1 can trigger a falling edge of OUTPUT 2. Furthermore, as illustrated, the clock signal (CLK) can have a short clock pulse at a beginning (or end) of each cycle of OUTPUT 1 and OUTPUT 2.

Figure 5:
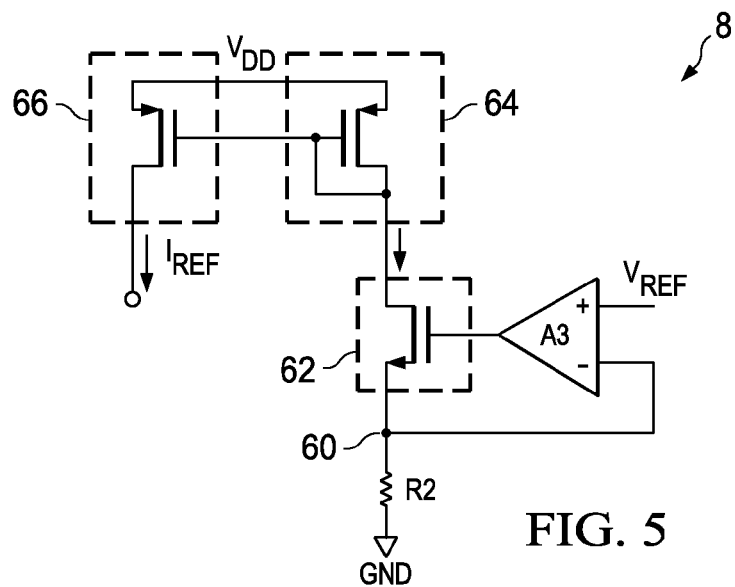
FIG. 5 illustrates an example of a circuit diagram of a reference V-I converter.

Referring back to FIG. 1, the adaptive slope generator 2 can further include a reference V-I converter 8 that can convert the reference voltage $V_{REF}$ into a corresponding reference current $I_{REF}$. FIG. 5 illustrates an example of a circuit diagram that could be employed as the reference V-I converter 8. The reference V-I converter 8 can receive the reference voltage $V_{REF}$ at a non-inverting input of an op-amp A3. An inverting input of the op-amp A3 can be coupled to a given node 60. An output terminal of the op-amp A3 can be coupled to a gate of an nMOS 62. A source of the nMOS 62 can be coupled to the given node 60. Additionally, a first terminal of a sensing resistor (or reference resistor), R2 can be coupled to the given node 60. A second terminal of the sensing resistor (or reference resistor), R2 can be coupled to an electrically neutral node (e.g., ground), which is labeled in FIG. 5 as "GND".

The drain of the nMOS 62 can be coupled to a drain and a gate of a first pMOS 64. A source of the first pMOS 64 can be coupled to a voltage source which can be set to a predetermined value (e.g., 5 V) which is labeled in FIG. 5 as "$V_{DD}$". A second pMOS 66 can be arranged in a current mirror configuration with the first pMOS 64. A source of the second pMOS 66 can provide a current $I_{REF}$ that can be determined from Equation 3.

$$I_{REF} = \frac{V_{REF}}{R_2} \qquad \text{Equation 3}$$

wherein:

$R_2$ is the resistance of the sensing (or reference) resistor.

Figure 6:
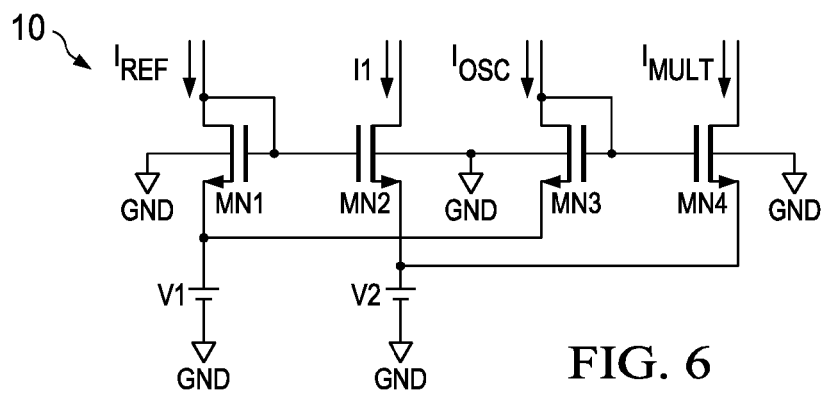
FIG. 6 illustrates an example of a circuit diagram of a translinear multiplier.

Referring back to FIG. 1, the adaptive slope generator 2 can include a translinear multiplier 10 configured to receive the three output currents, $I_1$, $I_{OSC}$ and $I_{REF}$ from the error compensated V-I converter 4, the oscillator 6 and the reference V-I converter 8, respectively. FIG. 6 illustrates an example of circuit diagram that can be employed to implement the translinear multiplier 10. The translinear multiplier 10 can include four nMOSs, MN1, MN2, MN3 and MN4. Each of the nMOSs MN1, MN2, MN3 and MN4 can have a bulk terminal (e.g., body) coupled to an electrical neutral node (e.g., ground), which is labeled in FIG. 6 as "GND". nMOSs MN1 and MN3 can each have a source coupled to a positive terminal of a voltage source V1 that can provide a voltage of about 400 mV. Moreover, a negative terminal of the voltage source V1 can be coupled to an electrically neutral node (e.g., ground). nMOSs MN2 and MN4 can each have a source coupled to a positive terminal of a voltage source V2 that can provide a voltage of about 400 mV at a first terminal. Moreover, a negative terminal of the voltage source V2 can be coupled to an electrically neutral node (e.g., ground).

The nMOS MN1 can receive the reference current $I_{REF}$ at a drain. Additionally, the drain of the nMOS MN1 can be coupled to a gate of the nMOS MN1 and a gate of the nMOS MN2. A drain of the nMOS MN2 can receive the current $I_1$. Moreover, a drain of the nMOS MN3 can receive the oscillating current $I_{OSC}$ (e.g., via the drain of pMOS 50 of FIG. 2). Additionally, the drain of the nMOS MN3 can be coupled to a gate of the nMOS MN1 and a gate of the nMOS MN4. A drain of the nMOS MN4 can provide a multiplied current $I_{MULT}$ of the translinear multiplier 10. By configuring the translinear multiplier 10 in the manner illustrated, the multiplied current $I_{MULT}$ can be determined from Equation 4.

$$I_{MULT} = \frac{I_1 * I_{OSC}}{I_{REF}} \qquad \text{Equation 4}$$

Referring back to FIG. 1, by employing substitution with Equations 1-3 into Equation 4, $I_{MULT}$ can also be determined from Equation 5:

$$I_{MULT} = \frac{V_{OUT} - V_{REF}}{R_1} * \frac{R2}{V_{REF}} * I_{OSC} \qquad \text{Equation 5}$$

Equation 5 can be simplified to Equation 6 in examples where $V_{REF}$ is 1 V and $R_1$ and $R_2$ have substantially equal resistances.

$$I_{MULT} = V_{OUT} * I_{OSC} - I_{OSC} \qquad \text{Equation 6:}$$

Figure 7:
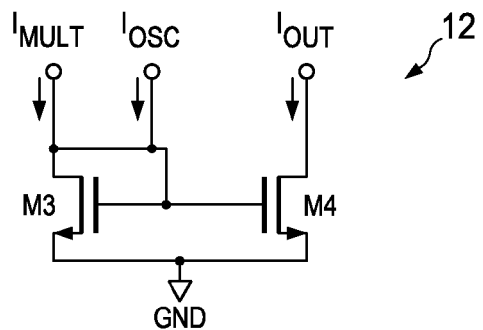
FIG. 7 illustrates an example of a circuit diagram of a current mirror.

A current mirror 12 of the adaptive slope generator 2 can receive the multiplied current of the translinear multiplier 10, $I_{MULT}$ and the oscillation current $I_{OSC}$ to generate an output current $I_{OUT}$. FIG. 7 illustrates an example of a circuit diagram that can be employed as the current mirror 12. The current mirror 12 can include an nMOS M3 that receives $I_{MULT}$ and $I_{OSC}$ at a drain and a gate. In some examples, $I_{OSC}$ can be provided via the drain of pMOS 51 illustrated in FIG. 3. Another nMOS M4 can be coupled to the gate of the nMOS M3 in a current mirror configuration. Moreover, both nMOS M3 and nMOS M4 can have sources coupled to an electrically neutral node (e.g., ground), which is labeled in FIG. 7 as "GND". A drain of the nMOS M4 can provide the output current $I_{OUT}$. By configuring the current mirror 12 in this manner, $I_{OUT}$ can be determined from Equation 7.

$$I_{OUT} = V_{OUT} * I_{OSC} \quad \text{Equation 7:}$$

The output current $I_{OUT}$ can be provided to a ramp generator 14. The ramp generator 14 can also receive the clock signal ("CLK") and generate the slope compensation signal $S_1$ that has a sawtooth shape. $S_1$ can be provided as the slope compensation signal to a controller (not shown) that controls the switching current which corresponds to the output voltage $V_{OUT}$.

Figure 8:
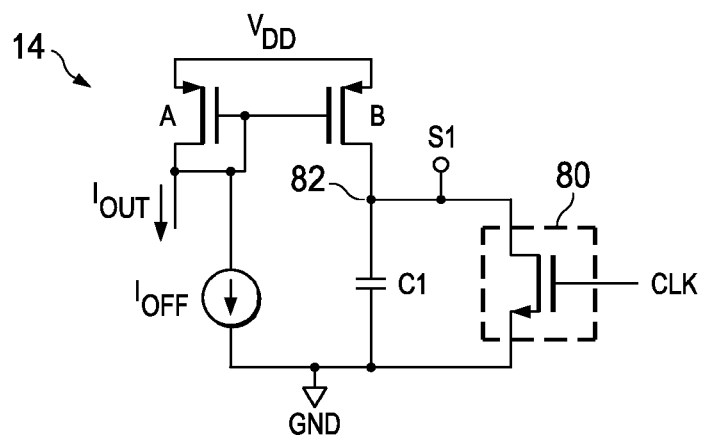
FIG. 8 illustrates an example of a circuit diagram of a ramp generator.

FIG. 8 illustrates an example of a circuit diagram that could be employed as the ramp generator 14. The ramp generator 14 can include two pMOSs, A and B arranged in a current mirror configuration. Each of the pMOSs A and B can have sources coupled to a voltage source (e.g., about 5 V) that is labeled in FIG. 8 as "$V_{DD}$". pMOS A can be receive $I_{OUT}$ at a drain and a gate. Moreover, pMOS B can have a gate coupled to the gate of pMOS A, such that $I_{OUT}$ can also be coupled to the gate of pMOS B. In some examples, an independent current source can provide an offset current $I_{OFF}$ at the drain and gate of pMOS A and the gate of pMOS B. The ratio of saturation drain-to-source currents of pMOSs A and B can define a transfer ratio of the current mirror of pMOSs A and B.

The clock signal (labeled in FIG. 8 as "CLK") can be received at a gate of an nMOS 80. The source of the nMOS 80 can be coupled to an electrically neutral node (e.g., ground), which is labeled in FIG. 8 as "GND". A drain of pMOS B and a drain of the nMOS 80 can be coupled to a given node 82. The given node 82 can also be coupled to a capacitor, C1 at a first terminal. In some examples, C1 can be referred to as a slope compensation capacitor. A second terminal of the capacitor C1 can be coupled to an electrically neutral node (e.g., ground). A signal resulting at the drain of the nMOS 80 can provide the slope compensation signal $S_1$.

Figure 9:
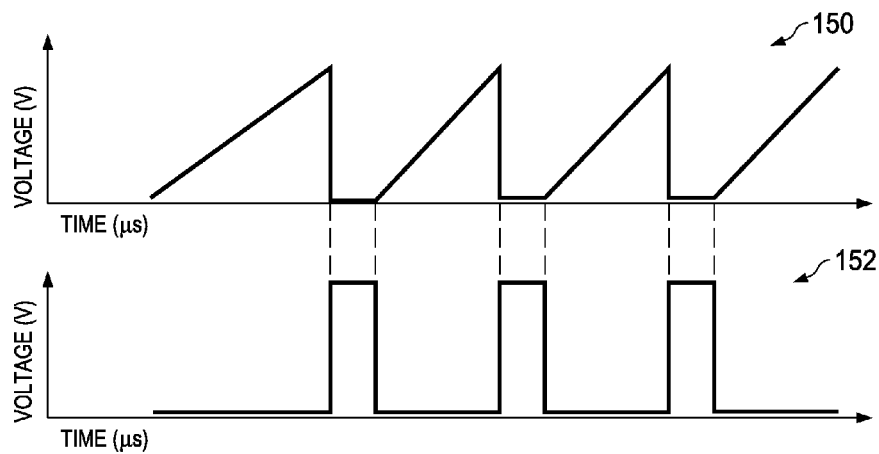
FIG. 9 illustrates an example of timing diagrams of a compensation signal (S1) and a clock signal (CLK).

FIG. 9 illustrates an example of timing diagrams 150 and 152 plotting voltage in volts (V) as a function of time in microseconds (μs). A first timing diagram 150 plots the slope compensation signal S1 of FIG. 1 and a second timing diagram 152 plots the clock signal (as illustrated in FIG. 8). As is illustrated, $S_1$ is a sawtooth wave, and the clock signal is a square wave. Moreover, a rising edge of the clock signal 152 initiates a falling edge of S1. Additionally, a falling edge of the clock signal 152 can trigger a rising edge of S1.

Referring back to FIG. 1, as noted, S1 can be employed as a slope compensation signal for $V_{OUT}$, such that the slope of S1 varies as a function of $V_{OUT}$. The optimal slope of S1 can define a value of slope compensation that ensures stability of a current loop at optimal damping. The optimal (e.g., critical) slope of S1, could be determined from Equation 8.

$$m_c = \frac{V_{OUT} * R_S * G}{L} * (D - 0.3) \quad \text{Equation 8}$$

wherein:
$m_c$ is the optimal (e.g., critical) slope of S1;
$R_s$ is the resistance of a sensing resistor;
G is a system constant defining the current sense gain of the circuit;
L is the inductance of an inductor coupled to a load (e.g., a switching inductor); and
D is the duty cycle of the switching current;

As described herein, the adaptive slope generator 2 can be implemented with field effect transistors (FETs), resistors and capacitors. Thus, the adaptive slope generator 2 can be implemented with an assumption described in Equation 9:

$$K_{FL} = \frac{L * f_s}{R_S} \quad \text{Equation 9}$$

wherein:
$K_{FL}$ is a circuit defined constant value that can be set based on properties of the sensing resistor and the inductance of the inductor coupled to the load (e.g., the switching inductor);
$f_S$ is the switching frequency of the switching current and approximated as Iosc and $f_S \propto I_{OSC}$ (e.g., $f_S$ is proportional to $I_{OSC}$);
$L \propto 1/f_S$ (e.g., L is proportional to $1/f_S$);
$L \propto R_S$ (e.g., L is proportional to $R_S$).

Accordingly, Equation 9 can be substituted into Equation 8, which can be simplified as Equation 10:

$$m_c = \frac{V_{OUT} * I_{OSC} * G}{K_{FL}} * (D - 0.3) \quad \text{Equation 10}$$

wherein:
$m_c$ is the optimal (e.g., critical) slope of S1.
Equation 11 can define a relationship between the capacitance of C1 and the optimal slope, $m_c$ $$\frac{V_{C_1}}{t} = \frac{I_{CAP}}{C1} = m_C \quad \text{Equation 11}$$

wherein:
$I_{CAP}$ is a current cap (e.g., a maximum current) and $I_{CAP} = V_{OUT} * I_{OSC}$;
t is a given point in time;
$V_{C_1}$ is a voltage across the capacitor C1 (illustrated in FIG. 7); and
C1 is the capacitance of the capacitor C1.

By employing Equation 10 and by employing $I_{CAP} = V_{OUT} * I_{OSC}$, Equation 11 can be solved for C1, as shown in Equation 12.

$$C1 = \frac{K_{FL}}{G(D - 0.3)} \quad \text{Equation 12}$$

Further, since $K_{FL}/G$ can be approximated as a fixed ratio, the capacitance of C1 can be approximated with Equation 13. As shown in Equation 13, the capacitance of C1 can be approximated as only depending on the duty cycle, D, as all other factors are fixed.

$$C1 \approx \frac{K_{NEW}}{(D - 0.3)} \quad \text{Equation 13}$$

wherein:
$K_{NEW} \approx K_{FL}/G$
Moreover, by matching C1 to $C_{O1}$ and $C_{O2}$ (illustrated in FIG. 3), the oscillation current $I_{OSC}$ can be more precise and variations in the capacitance of C1 (e.g., due to fabrication tolerances) can be accommodated without a substantial effect on the adaptive slope generator 2. Further, as illustrated in FIG. 8, by charging capacitor C1 via the current mirror configuration, a voltage slope of S1, $m_s$ can be generated. Moreover, the voltage slope, $m_s$ can be determined from Equation 14.

$$m_s = \frac{V_{OUT} * K_R * I_{OSC}}{C1} \quad \text{Equation 14}$$

wherein:

$K_R$ is a circuit parameter that can be based, for example, on an aggregate of a transfer ratio for current mirrors in the adaptive slope generator 2 and $K_R$ can have a value of about 1 to about 1000.

Additionally, in many instances $m_c \approx m_s$. Furthermore, by adjusting the transfer ratio of pMOSs A and B in the ramp generator 14 illustrated in FIG. 8, the voltage slope, $m_s$ of S1 can be adjusted for certain cases of the duty cycle, D and $K_{FL}$. Still further, by applying the offset current $I_{OFF}$ a default current can be applied that can set a minimum voltage slope for $m_s$. The slope compensation signal S1 can be provided to the controller (not shown) that can employ the slope compensation signal S1 to adjust the switching current that corresponds to $V_{OUT}$.

By employing the adaptive slope generator 2, a current mode DC-to-DC converter with a duty cycle above or below 50% can be realized. Moreover, the adaptive slope generator 2 can be implemented with field effect transistors (e.g., nMOSs and pMOSs) and without the need for current driven transistors, such as bipolar junction transistors (BJTs). Further, the transistors of the adaptive slope generator 2 can operate in saturation mode, thereby obviating the need for a relatively large transistor that operates in linear mode and/or is employable as a voltage sensor for low and high voltages (e.g., 4 V, 8 V, etc.). Still further, as is illustrated in FIGS. 2-9, the adaptive slope generator 2 can be implemented as a purely analog solution, thereby avoiding the need for sampling, and/or a high frequency clock signal while still achieving an equivalent function of a digital slope compensation adaptive slope generator.

Figure 10:
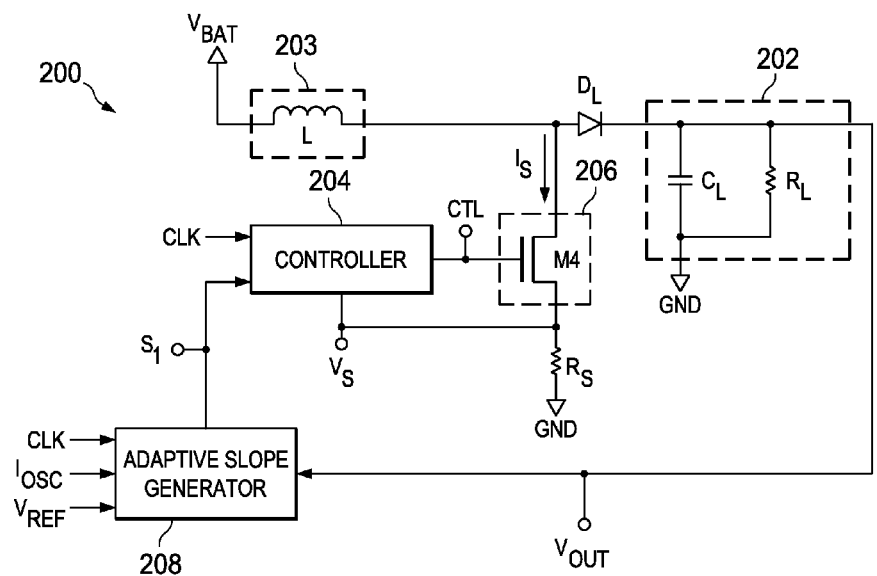
FIG. 10 illustrates an example of a system that drives a load.

FIG. 10 illustrates an example of system 200 that can employ the adaptive slope generator 2 illustrated in FIG. 1. The system 200 can be implemented, for example, in a current mode DC-DC converter. The system 200 can include a load 202 that can include a capacitive component $C_L$ and a resistive component $R_L$. In some examples, the resistive component $R_L$ can have a resistance (or equivalent impedance) of about 3-8 Ohms (Ω). The load 202 can be coupled to an electrically neutral node (e.g., ground), which is labeled in FIG. 10 as "GND". The load 202 can be coupled to a cathode of a diode $D_L$ that can ensure that current only flows in one direction. Moreover, an inductor L 203 (e.g., the inductor of Equations 8 and 9) can be coupled to a voltage source (e.g., a battery of about 12 V) that is labeled in FIG. 10 as "$V_{BAT}$"

The system 200 can also include a controller 204 that can receive a clock signal (labeled in FIG. 10 as "CLK") and provide a control signal CTL to a gate node of an nMOS 206 (e.g., a switch) to provide a switching current $I_S$ via a drain of the nMOS 206. The drain of the nMOS 206 can be coupled to an anode of the diode $D_L$ and to the inductor L 203. A source of the nMOS 206 can be coupled to a sensing resistor $R_S$. In one example, the sensing resistor $R_S$ can have a resistance of about 100 milliohms (mΩ). A sensed voltage $V_S$ that can characterize the switching current $I_s$ can be provide to the controller. The controller 204 can employ the sensed voltage $V_S$ to determine a slope of current provided to the load 202.

Additionally, the system can include an adaptive slope generator 208. The adaptive slope generator could be implemented, for example, in a manner similar to the adaptive slope generator 2 illustrated in FIG. 1. The adaptive slope generator 208 can receive a reference voltage $V_{REF}$ (e.g., about 1 V), the clock signal and an oscillation current $1_{OSC}$. Additionally, the adaptive slope generator 208 can receive an output voltage $V_{OUT}$ that is substantially equal to a voltage drop across the load 202.

The adaptive slope generator 208 can be configured to generate a slope compensation signal S1 based on Equations 1-14 in the manner described herein. The controller 404 can adjust the control signal based on the slope compensation signal S1 and the sensed voltage $V_S$ (which corresponds to the switching current $I_s$) to adjust the slope of the switching current $I_S$ by adjusting the control signal CTL. Such an adjustment of the switching current $I_s$ can ensure that the slope of the switching current $I_s$ remains at or near a desired value. In this manner, the switching current $I_S$ can be stabilized for duty cycles above and below 50%. Further, by adjusting the slope of the switching current $I_S$ based on the slope compensation signal S1 (which has an optimal slope), a transient response of the system 200 (e.g., a current mode DC-DC converter) can be kept at an optimal level for wide ranges in the voltage source $V_{BAT}$ and/or the output voltage $V_{OUT}$ (e.g., about 4 V to about 80 V) as well as wide frequency ranges. Thus, the system 200 would continue to operate in current mode such that the system 200 would have a fast reaction to changes in the load 202, the output voltage $V_{OUT}$ and/or the voltage source $V_{BAT}$.

Figure 11:
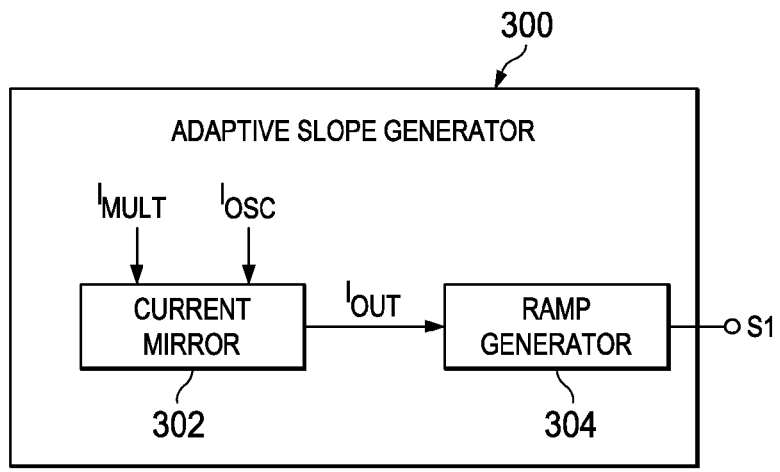
FIG. 11 illustrates another example of an adaptive slope generator.

FIG. 11 illustrates another example of an adaptive slope generator 300 that could be employed to implement the adaptive slope generator 2 illustrated in FIG. 1. The adaptive slope generator 300 could be partially or wholly implemented on an IC chip. The adaptive slope generator 300 can include a current mirror 302 configured to receive a multiplied current ($I_{MULT}$) that varies as a function of an output voltage and frequency of a switching current. The output voltage can characterize the switching current provided to a load (e.g., the load 2 illustrated in FIG. 10). The current mirror 302 can also be configured to receive an oscillation current ($I_{OSC}$). The oscillation current ($I_{OSC}$) can have an amplitude that corresponds to a switching frequency of the switching current. The current mirror 302 can further be configured to generate an output current ($I_{OUT}$) substantially equivalent to the product of the oscillation current ($I_{OSC}$) and the output voltage. The adaptive slope generator 300 can also include a ramp generator 304 configured to generate a slope compensation signal (S1) based on the output current the slope compensation signal (S1) having a sawtooth shape and a slope that varies as a function of the output voltage.

Figure 12:
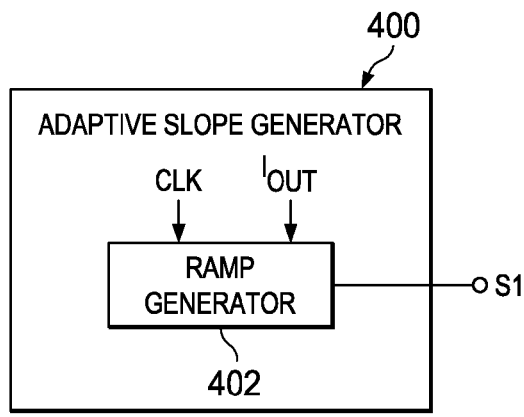
FIG. 12 illustrates yet another example of an adaptive slope generator.

FIG. 12 illustrates another example of an adaptive slope generator 400 that could be employed to implement the adaptive slope generator 2 illustrated in FIG. 1. The adaptive slope generator 400 could be partially or wholly implemented on an IC chip. The adaptive slope generator 400 can include a ramp generator 402 configured to receive a clock signal (CLK). The ramp generator 400 can also be configured to receive an output current ($I_{OUT}$) that characterizes a product of an output voltage and an oscillation current ($I_{OSC}$). The adaptive slop generator 400 can further be configured to generate a slope compensation signal (S1) having a sawtooth shape and a slope that varies as a function of the output voltage and a capacitance of a slope compensation capacitor (e.g., the capacitor C1 illustrated in FIG. 8). The output voltage can correspond to voltage at a sensing resistor (e.g., $R_S$ illustrated in FIG. 10) that characterizes a current provided to an inductor (e.g., the inductor 203 illustrated in FIG. 10). The oscillation current ($I_{OSC}$) can have an amplitude that corresponds to a switching frequency of the load (e.g., the load 202 illustrated in FIG. 10).

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An adaptive slope generator comprising:
   a current mirror configured to:
      receive a multiplied current that varies as a function of an output voltage and a switching frequency of a switching current, wherein the output voltage characterizes the switching current provided to a load coupled to an inductor;
      receive an oscillation current, wherein the oscillation current has an amplitude that corresponds to the switching frequency of the switching current;
      generate an output current substantially equivalent to the product of the oscillation current and the output voltage; and
   a ramp generator configured to generate a slope compensation signal based on the output current, the slope compensation signal having a sawtooth shape and a slope that varies as a function of the output voltage.

2. The adaptive slope generator of claim 1, wherein the ramp generator further comprises a slope compensation capacitor, wherein the slope of the slope compensation signal also varies as a function of a capacitance of the slope compensation capacitor.

3. The adaptive slope generator of claim 2, wherein:

$$m_s = V_{OUT} \cdot K_R \cdot I_{OSC}/C$$

wherein:
   $m_s$ is the slope of the slope compensation signal;
   $V_{out}$ is the output voltage;
   $K_R$ is a circuit parameter with a range of about 1 to about 1000;
   $I_{OSC}$ is the oscillation current; and
   C is the capacitance of the slope compensation capacitor.

4. The adaptive slope generator of claim 2, wherein the ramp generator further comprises a current mirror having a transfer ratio, wherein the slope of the slope compensation signal also varies as a function of the transfer ratio of the current mirror.

5. The adaptive slope generator of claim 4, wherein the ramp generator further comprises an offset current configured to set a minimum slope of the slope compensation signal.

6. The adaptive slope generator of claim 1, further comprising a translinear multiplier configured to:
   receive a first current that varies as a function of the output voltage;
   receive the oscillation current;
   receive a reference current that comprises a current that varies based on a reference voltage and a given reference resistor; and
   generate the multiplied current, the multiplied current being substantially equal to a product of the output voltage and the oscillation current minus the oscillation current.

7. The adaptive slope generator of claim 6, further comprising an error compensated voltage to current (V-I) converter configured to generate the first current that characterizes a difference of the output voltage and the reference voltage divided by a resistance of another reference resistor.

8. The adaptive slope generator of claim 7, wherein the given reference resistor and the another reference resistor have substantially equal resistances.

9. The adaptive slope generator of claim 8, wherein the reference voltage is about 1 volt (V).

10. The adaptive slope generator of claim 1 comprising a plurality of field effect transistors (FETs).

11. The adaptive slope generator of claim 10, wherein each of the FETs is configured to operate in saturation mode.

12. The adaptive slope generator of claim 1, wherein the adaptive slope generator is configured in the absence of a bipolar junction transistor (BJT).

13. An integrated circuit (IC) chip comprising the adaptive slope generator of claim 1.

14. The IC chip of claim 13, further comprising:
   a controller configured to:
   provide a control signal to a switch to control the switching current provided to the load; and
   adjust a slope of the switching current based on the slope compensation signal.

15. An adaptive slope generator comprising:
   a ramp generator configured to:
      receive a clock signal;
      receive an output current that characterizes a product of an output voltage and an oscillation current; and
      generate a slope compensation signal having a sawtooth shape and a slope that varies as a function of the output voltage and a capacitance of a slope compensation capacitor;
      wherein the output voltage corresponds to voltage at a load coupled to an inductor;
      wherein the oscillation current has an amplitude corresponding to a switching frequency of a switching current provided to the load.

16. The adaptive slope generator of claim 15 further comprising:
   a reference voltage to current (V-I) converter configured to generate a reference current based on a reference voltage;
   a translinear multiplier configured to:
      receive a first current from an error compensated V-I converter that varies as a function of the output voltage;
      receive the oscillation current from an oscillator; and
      receive the reference current from the reference V-I converter; and
   generate a multiplied current, wherein:

$$I_{MULT} = \frac{I_1 * I_{OSC}}{I_{REF}};$$

wherein:
$I_{MULT}$ is the multiplied current;
$I_1$ is the first current;
$I_{OSC}$ is the oscillation current; and
$I_{REF}$ is the reference current.

17. The adaptive slope generator of claim 15, wherein:

$$m_s = \frac{V_{OUT} * K_R * I_{OSC}}{C}$$

wherein:
$m_s$ is the slope of the slope compensation signal;
$V_{out}$ is the output voltage;
$K_R$ is a circuit parameter with a range of about 1 to about 1000;
C is the capacitance of the slope compensation capacitor.

18. The adaptive slope generator of claim 15, wherein the ramp generator further comprises a current mirror having a transfer ratio, wherein the slope of the slope compensation signal also varies as a function of the transfer ratio of the current mirror.

19. The adaptive slope generator of claim 18, wherein the ramp generator further comprises an offset current configured to set a minimum slope of the slope compensation signal.

20. An integrated circuit (IC) chip comprising:
an error compensated voltage to current (V-I) converter configured to output a first current that characterizes an output voltage, wherein the output voltage characterizes a switching current provided to a load coupled to an inductor;
an oscillator configured to provide an oscillation current that has an amplitude that corresponds to a switching frequency of the switching current;
a reference V-I converter configured to generate a reference current based on a reference voltage;
a translinear multiplier configured to:
generate a multiplied current, the multiplied current being substantially equal to a product of the output voltage and the oscillation current minus the oscillation current;
a current mirror configured to:
generate an output current substantially equivalent to the product of the oscillation current and the output voltage; and
a ramp generator configured to generate a slope compensation signal having a sawtooth shape and a slope that varies as a function of the output voltage, wherein the slope of the switching current is based on the slope compensation signal.

* * * * *